United States Patent [19]

Hayashi et al.

[11] Patent Number: 5,315,662
[45] Date of Patent: May 24, 1994

[54] KARAOKE EQUIPMENT

[75] Inventors: Kazuhiro Hayashi; Jun Honda; Michitaka Fujita; Kunihiro Miyata, all of Tokyo, Japan

[73] Assignee: Pioneer Electronic Corporation, Tokyo, Japan

[21] Appl. No.: 909,690

[22] Filed: Jul. 7, 1992

[30] Foreign Application Priority Data

Jul. 12, 1991 [JP] Japan ................... 3-172710

[51] Int. Cl.⁵ .............................................. H03G 3/00
[52] U.S. Cl. ...................................... 381/107; 381/118
[58] Field of Search ................... 381/57, 107, 119, 118

[56] References Cited

U.S. PATENT DOCUMENTS

| | | | |
|---|---|---|---|
| 5,046,107 | 9/1991 | Iwamatsu | 381/107 |
| 5,054,077 | 10/1991 | Suzuki | 381/119 |
| 5,130,665 | 7/1992 | Walden | 381/107 |
| 5,195,075 | 3/1993 | Shiba et al. | 381/107 |

Primary Examiner—Forester W. Isen
Attorney, Agent, or Firm—Sughrue, Mion, Zinn, Macpeak and Seas

[57] ABSTRACT

A karaoke device which automatically returns the level of a microphone volume to a presettled level at the beginning or end of individual music pieces, and which is capable of gradually reducing the gain of the microphone amplifier by a predetermined value when an output volume from the microphone amplifier becomes excessively loud during the playing of a music piece. The karaoke device includes an adjustor for adjusting the level of the microphone volume in accordance with a manual instruction or an instruction from a control circuit; a level detector for detecting when the volume level is greater than a predetermined level; a music piece detector for detecting a beginning or end of each music piece; and a control circuit that compares a standard volume level and the volume level of when a detected signal is outputted from the music piece detector, and controls the adjustor to equalize the output level to the previously stored standard level. According to the second aspect of the invention, a comparator compares the output level from the adjustor and a predetermined reference level to lower the output level until the music piece terminates.

5 Claims, 4 Drawing Sheets

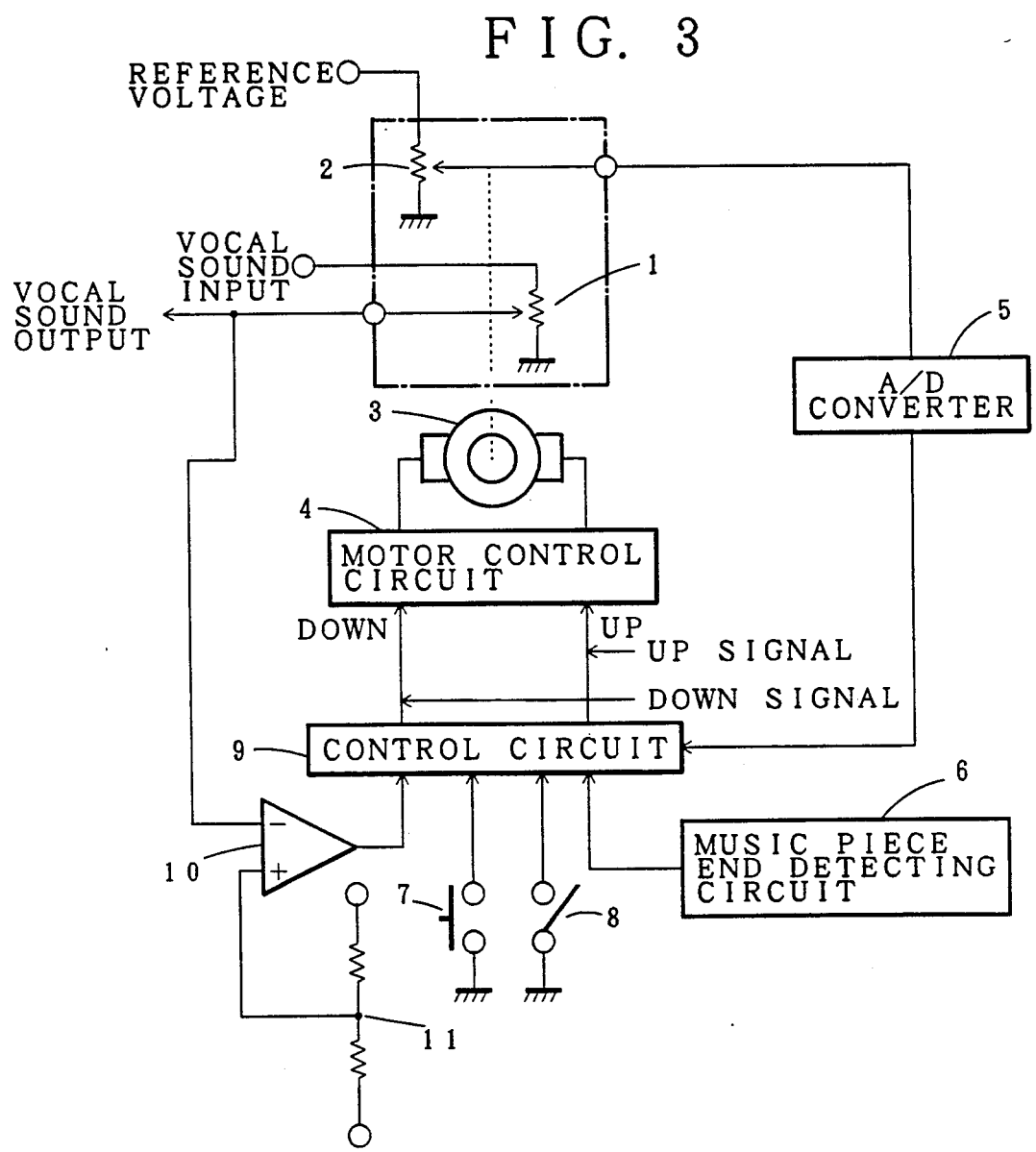

KARAOKE EQUIPMENT

BACKGROUND OF THE INVENTION

1. Field of the Invention

The present invention relates to a Karaoke equipment, which is an apparatus that radiates through a loudspeaker a piece of music as an accompaniment for a song reproduced from a recording medium and the singer's vocal when the singer sings toward a microphone to the accompaniment, and more particularly to a karaoke equipment in which when a previously stored sound volume or echo volume is varied by a singer, the thus varied value of the sound volume or echo volume is automatically returned to the previously stored level when a music piece is finished, and a gain of the microphone amplifier is also automatically lowered when an output level of the microphone exceeds a predetermined value.

2. Description of the Prior Art

Conventionally, the level of a microphone volume, a sound reproduction volume of a music tape or of a compact disk, and echo volume and so on in a karaoke equipment have been manually adjusted by individual singers in accordance with their respective tastes. Besides, when an input level to a microphone exceeds a maximum level, the volume thereof has been manually adjusted to an optimum level.

It is to be noted that since the level of a microphone volume, a reproduction volume, and of an echo volume of a music tape and so on in the karaoke equipment of the foregoing type are all manually adjusted by individual singers, these manually adjusted conditions have to be returned to the previously stored standard value whenever there is a change of a singer or the like, and this has been a troublesome job.

And still further, although an automatic level control circuit in recording systems is conventionally known for coping with an excessive input volume, which rapidly lowers the gain of a microphone amplifier responding to the foregoing excessive input volume and adjusts thereafter to gradually recover the gain, it is to be noted that since the sensitivity thereof at the initial state (during which there is no sound) has been substantially raised, a howling is likely to occur and accordingly an excessive loud sound is produced on starting to sing a piece of music.

Further, when an excessive input volume is caused by mistake such as unconsciously banging a microphone to something else and so on, the gain of the microphone amplifier cannot be recovered, or sometimes even disconnected for a certain period, whereby even when a singer sings modulating his voice for effect, the voice is flatted and thus the modulation of the volume of his voice cannot be reproduced faithfully, which is not a preferable phenomenon to a Karaoke equipment.

SUMMARY OF THE INVENTION

The present invention has been made to eliminate such problems as described above, and it is an object of the present invention to obtain a karaoke equipment which automatically recovers the level of a microphone volume, a sound reproduction volume, and that of an echo volume to a presettled level at ending or starting point of individual music pieces, and which gradually reduces the gain of the microphone amplifier for a predetermined certain value each time when an output volume from the microphone amplifier becomes excessively loud.

The present invention has been made to achieve the above object, and is constructed such that it comprises an adjustor for adjusting at least a level of the microphone volume in accordance with a manual instruction or an instruction from a control circuit; a level detector for detecting the above level of the present time; a music piece detector for detecting an ending or starting point of each music piece; a control circuit that previously stores a standard level, compares, when a detected signal is outputted from the music piece detector, the level of the output value from the level detector and the previously stored standard level, and controls the adjustor so as to equalize the output level to the previously stored standard level.

The present invention made to achieve the above object also comprises a comparator that detects an output level from the adjustor, compares the output level and a Predetermined reference level, and sends a signal when the output level is greater than the predetermined reference level, whereby the present invention is constructed such that in addition to the above function of the control circuit in which it previously stores a standard level of the microphone volume., compares, when a detected signal is outputted from said music piece detector, the level of output value from said level detector and the previously stored level of the microphone volume; and controls the adjustor for equalizing the output level to the previously stored standard level, the control circuit further controls the adjustor for lowering the level of the microphone volume by a predetermined value in accordance with an output signal from the comparator.

The karaoke equipment according to the present invention as constructed above is an equipment in which a standard level of a sound volume or the like is first previously settled, and when a singer manually changes this standard level to another level, the thus changed level is automatically returned to the standard level at the ending point of the music piece or at the starting point of the next music piece.

The karaoke equipment according to the present invention is also constructed such that when the sound output from the microphone amplifier exceeds a predetermined level, the level of the microphone volume is lowered by a predetermined value and when another sound output from the microphone amplifier exceeding the above predetermined level is inputted, the thus lowered level of the microphone volume is further lowered by a predetermined value, and furthermore, the lowered level of the microphone volume is automatically returned to the presettled standard level at the ending point of the music piece or at the starting point of the next music piece.

Other objects and features of the invention will be more fully understood from the following detailed description and appended claims when taken in conjunction with the accompanying drawings.

Figure 2A:
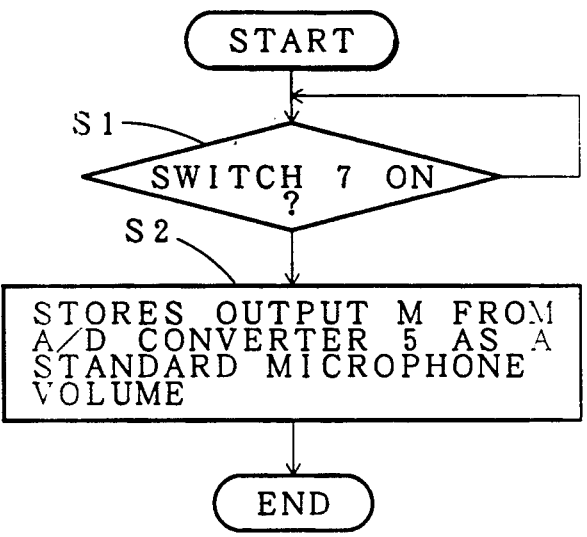
FIG. 2A is a flowchart showing an operation of a control circuit in the first embodiment.
Figure 4:
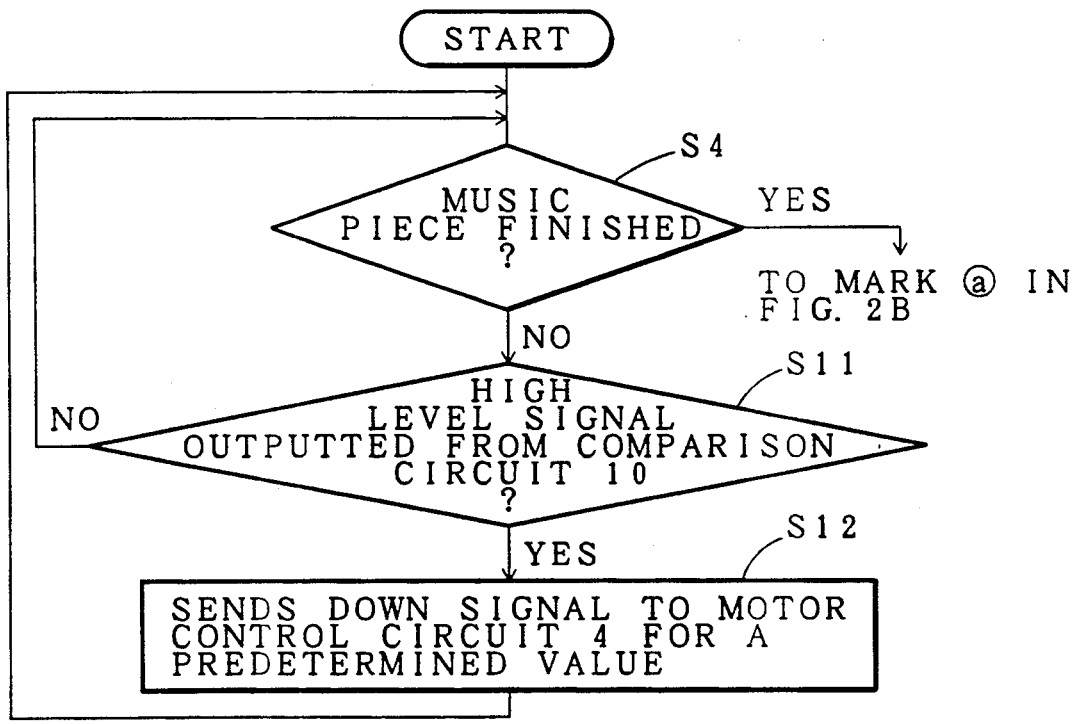
Figure 2B:
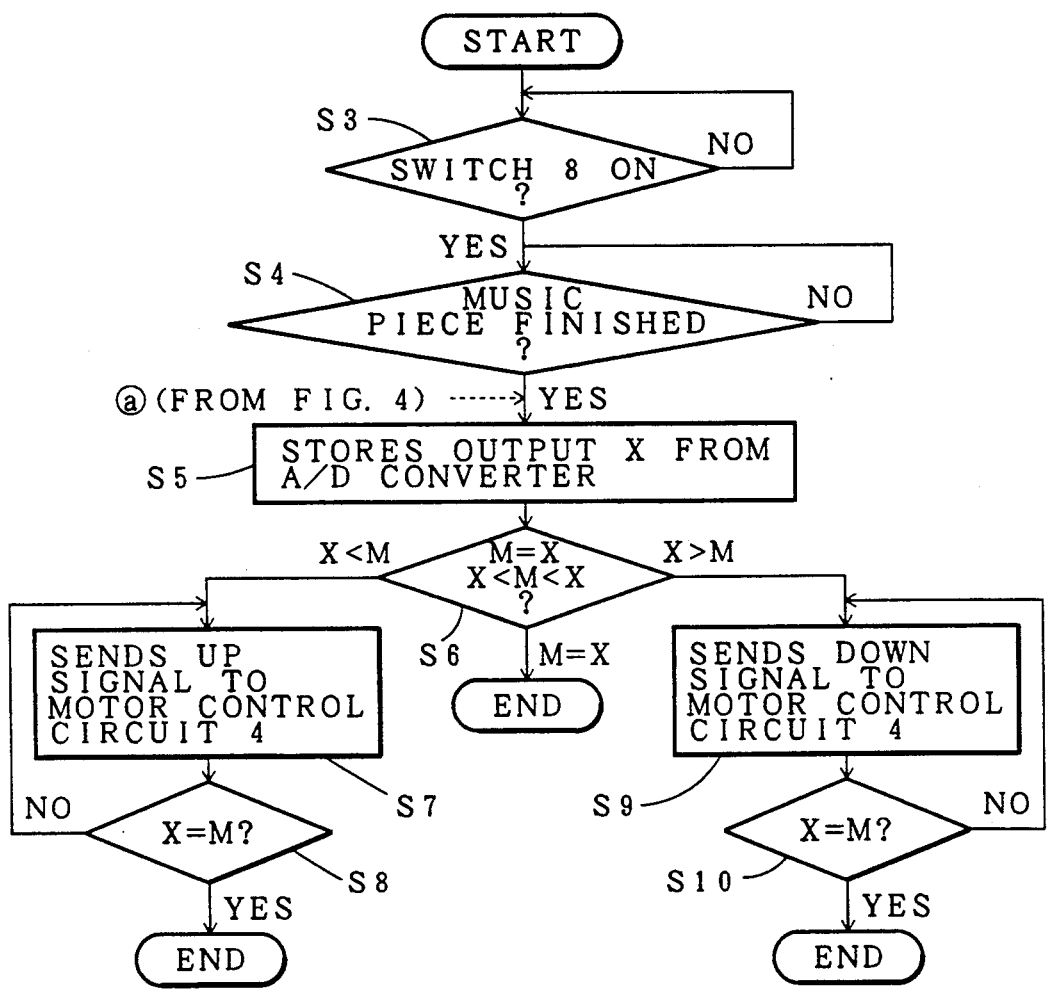
FIG. 2B is a flowchart showing an operation of a control circuit, wherein the procedure from the step S5 and downward is a common procedure with the second embodiment.

FIG. 3 is a block diagram showing a second embodiment of the present invention;

FIG. 4 is a flowchart showing an operation of a control circuit in the second embodiment, wherein the procedure advances to the step S5 of the flowchart in FIG. 2B when it is completed.

In the figures, reference numeral 1 denotes a microphone volume controller, 2 denotes a reference volume detector, 3 a motor, 4 a motor control circuit, 5 an A/D converter, 6 a music piece end detecting circuit, 7 a memory switch, 8 a selection switch, 9 a control circuit, and numeral 10 a comparison circuit, and reference numeral 11 denotes a reference voltage generator.

DETAILED DESCRIPTION OF THE PREFERRED EMBODIMENTS

In the following, a first embodiment of the present invention is described with reference to FIG. 1, wherein the level of the microphone volume is adjusted.

Reference numeral 1 denotes a microphone volume controller, numeral 2 denotes a reference volume detector which operates in connection with the microphone volume controller 1 and varies the resistance value thereof, and 3 denotes a motor for rotating both the volume controller 1 and the reference volume detector 2 in either directions, whereby the resistance value of the volume is either increased or reduced. It is to be noted that these volume controller 1 and the reference volume detector 2 can be manually operated as well by rotating the knob (not shown).

Reference numeral 4 denotes a control circuit for controlling the motor 3, which rotates in either directions in accordance with an output signal from a control circuit 9 (explained later on). Reference numeral 5 denotes an A/D (analog/digital) converter to convert an analog voltage from the reference volume detector 2 to digital data, which digital data being outputted to the control circuit 9 afterwards.

Reference numeral 6 denotes a music piece end detecting circuit provided to music reproducing equipments such as a tape recorder, a compact disk player, a video disk player and so on, wherein in the case of a tape recorder or a compact disk player, the music piece end detecting circuit sends an output signal on detecting a blank portion in which there is no signal recorded for more than a predetermined period between two music pieces or at the ending portion of the last piece, whereas in the case of a video disk player, the music piece end detecting circuit sends an output signal on detecting a portion where there is no horizontal synchronous signal, which is defined as an end of a music piece, and thereafter these respective output signals are sent to the control circuit 9.

It is to be noted that the music piece end detecting circuit 6 can be constructed such that it normally checks whether the horizontal synchronous signal exists and in case it is found, then the music source thereof is determined to be a video disk player, whereas when there is no horizontal synchronous signal found, then it is determined that the music source thereof can be either a tape recorder or a compact disk player, and operates the foregoing functions thereafter.

Reference numeral 7 denotes a memory switch for settling a standard level of the microphone volume, wherein an output data from the A/D converter at the moment when this memory switch 7 is switched on is sent to the control circuit 9 and stored therein. Reference numeral 8 denotes a selection switch for selecting whether or not the function enabled by the present invention as explained hereinafter should be operated after switching it on, and reference numeral 9 is a control circuit comprising a memory function such as a microcomputer, whose function is also explained hereinafter.

In the following, an operation of the above construction is described with reference to the flowcharts shown in FIGS. 2A and 2B, wherein FIG. 2A describes a procedure for storing the standard level of the microphone volume, whereas FIG. 2B shows a procedure when a sound is inputted through the microphone.

As shown in FIG. 2A, the control circuit 9 monitors whether the memory switch 7 is on state (step S1), and if it is detected that the memory switch 7 is on, an output data M from the A/D converter 5 is read by the control circuit 9 and stored therein (step S2), thereafter the value of the reference volume detector 2 at this time, which is the value of the microphone volume controller 1, is determined and stored as the standard level of the microphone volume.

Referring now to FIG. 2B, the control circuit 9 monitors whether the selection switch 8 is on (step S3), and when it is detected that the selection switch 8 is on, then it is further detected whether or not a music piece is finished by the music piece end detecting circuit 6 (step S4). Thereafter, when a signal indicating the detection of the music piece end is inputted from the music piece end detecting circuit 6, an output data X is read from the A/D converter 5 by the control circuit 9 and stored therein (step S5).

After these operations, the control circuit 9 compares the output data X and the output data M which had been read out when the memory switch 7 was switched on, in other words, it checks whether the relationship between these data are X=M (level of the microphone volume 1 has not been changed), or X<M (level of the microphone volume 1 has been varied and is made smaller than the standard level of the microphone volume), or X>M (level of the microphone volume 1 has been varied and is made louder than the standard level of the microphone volume)(step S6).

As a result of the above comparison, if the relationship between them is X=M, it is determined that the level of the microphone volume 1 has not been changed and the controlling operation thereof is finished, and if X<M, then it is determined that the level of the microphone volume control 1 has been reduced, and therefore a UP instruction is sent to the motor control circuit 4 (step S7). The motor control circuit 4 that has received the UP instruction sends a signal to augment the vocal sound output to the motor 3, so that the resistance value of the microphone volume controller 1 and that of the reference volume detector 2 are varied, and thus the output data from the A/D converter 5 is also varied. Accordingly, the control circuit 9 compares the output data X from the A/D converter 5 and the previously stored data M, and when the data X becomes equal to the data M in accordance with the above operation, sending of the UP instruction signal to the motor control circuit 4 is stopped and the operation terminates (step S8).

On the other hand, if the relationship between them is X>M, a DOWN instruction is sent to the motor control circuit 4 (step S9). The motor control circuit 4 that has received the DOWN instruction sends a signal to reduce the vocal sound output to the motor 3, so that the resistance value of the microphone volume controller 1 and that of the resistance volume detector 2 are varied, and the output data from the A/D converter 5 is also varied. Accordingly, the control circuit 9 compares the output data X from the A/D converter 5 and the previously stored data M, and when the data X becomes equal to the data M in accordance with the above operation, the signal output to the motor control circuit 4 is stopped and the operation terminates (step S10).

The above explanation relates to a level of the microphone volume, but it is not limited to the microphone volume and it can be applied to an automatic recovery of a level of the music source volume or echo volume as a matter of fact.

In the following, a second embodiment of the present invention is described with reference to FIG. 3. It is to be noted that same reference numerals as those in FIG. 1 denote the same circuit, and the explanation thereof is eliminated here to avoid repetition.

Figure 1:
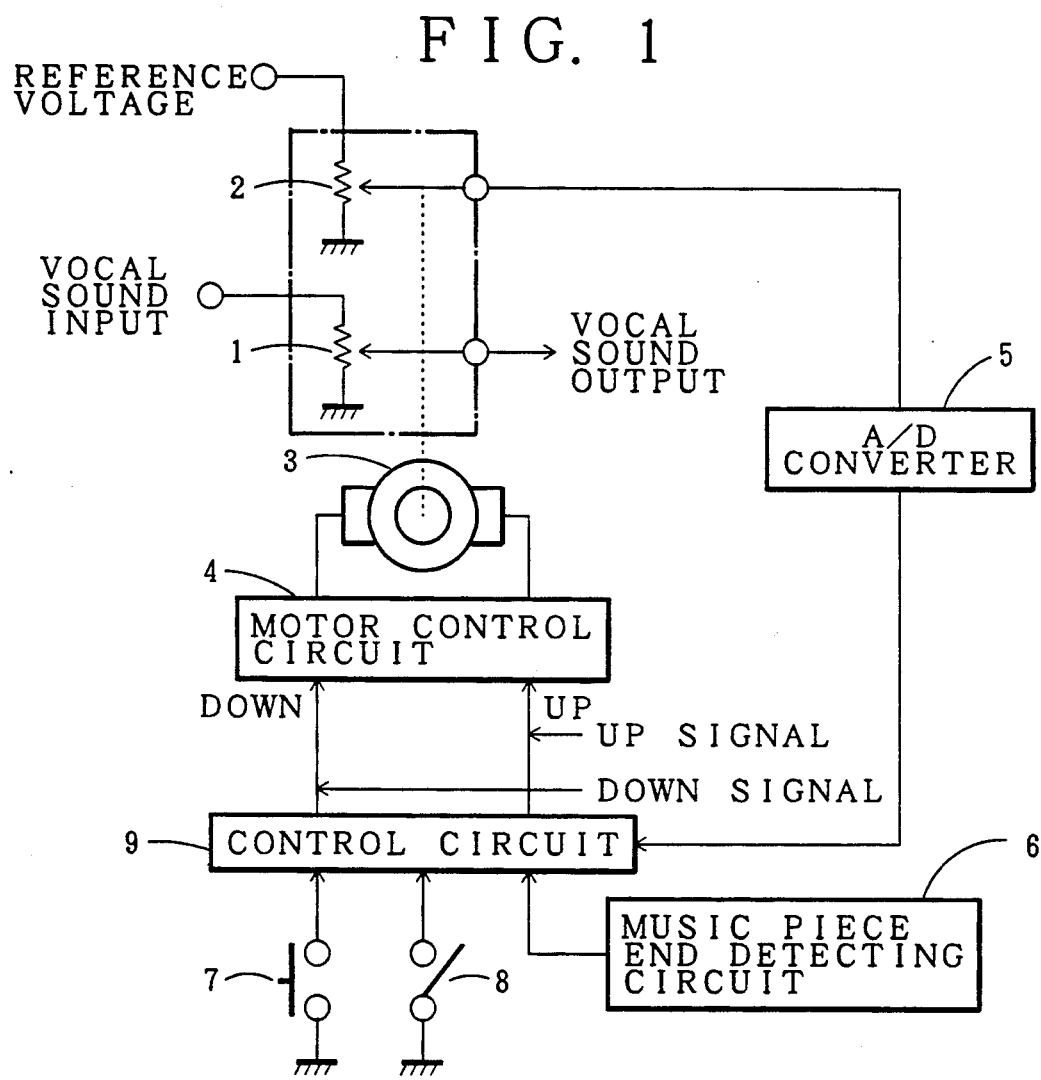
FIG. 1 is a block diagram showing a first embodiment of the present invention.

The second embodiment of the present invention is different from the first embodiment in that the output from the microphone volume controller 1 in FIG. 1 is inputted to one end of a comparison circuit 10, and the reference output from the reference voltage generator 11 is inputted to the other end of the comparison circuit 10, and the high level resulted from the comparison is inputted to the control circuit 9.

In the following, the operation in the second embodiment is now explained with reference to FIG. 4. First of all, as shown in the flowchart of FIG. 2B, in the case that even though the control circuit 9 detects the on state of the selection switch 8, a music piece is not finished yet by the music piece end detecting circuit 6 in step S4, which means that the same music piece is still being played, since the output from the microphone volume controller 1 is continuously inputted to one end of the comparison circuit 10, and the reference output voltage is inputted to the other end thereof, when the vocal sound signal that is controlled and outputted from the microphone volume controller 1 exceeds the reference output level, the comparison circuit 10 sends a high level output. Here, the control circuit 9 further monitors whether the outputted high level signal is inputted thereto (step S11), and as soon as it detects that the high level signal is inputted, then it sends out a DOWN instruction to the motor control circuit 4 for a predetermined period of time (step S12).

Thereafter, since the motor control circuit 4 that has received the DOWN instruction sends a signal for a predetermined period of time to the motor 3 to rotate it to lower the vocal sound output, the resistance value of the microphone volume controller 1 is varied and the vocal sound output is lowered, resulting that a distortion of a vocal sound which otherwise would be produced by an excessive vocal sound input can be avoided.

Further, when a further excessive level of vocal sound is inputted even after the above vocal sound output lowering operation to the microphone volume controller 1 is already done, and it exceeds the reference voltage of the reference voltage generator 11, the same operation is Proceeded again to lower the vocal sound output from the microphone. This operation is repeated this way until an output signal from the music piece end detecting circuit 6 is inputted to the control circuit 9, and when the output signal indicating the end of the music piece from the music piece end detecting circuit 6 is inputted to the control circuit 9, the operation returns to the step S4 of the flowchart in FIG. 2B and controls the level of microphone volume to return to the standard level thereof.

Although the resistance value of the microphone volume controller 1 and that of the reference volume detector 2 are varied by way of the motor 3 in the embodiment, those volume controller 1 and the reference volume detector 2 can be made by electronic devices, and the value thereof can be displayed by indication characters.

Further, although it is not explained clearly, it is needless to say that the UP and DOWN instructions connecting the motor control circuit 4 and the control circuit 9 can be manually operated as a matter of fact, and still further, although it is explained in the embodiment that the level of the volume is returned to the presettled standard value by controlling the volume when an ending portion of the music piece is detected, in fact, it can be done by detecting a starting point of the next music piece as well.

Effect of the Invention

The present invention is constructed such that it automatically returns the level of the microphone volume, a sound reproduction volume and that of echo volume to a presettled standard value at ending or starting of each music piece, and accordingly it is obviated to readjust the volume control whenever a singer or a music piece is changed to another.

Further, whenever a sound output from the microphone becomes excessively loud, the gain of the microphone amplifier is each time lowered by a predetermined level, and accordingly, even when an excessive level of sound is inputted by mistake or when a loud voice is suddenly inputted, the reduction of the level of sound is never excessively done thereby to reproduce the singer's voice faithfully even when he is modulating the volume of his voice for effect.

Having now fully described the invention, it will be apparent to one of ordinary skill in the art that many changes and modifications can be made thereto without departing from the spirit and scope of the invention as set forth herein.

What is claimed is:

1. A karaoke apparatus which generates through a loudspeaker a music piece from a recording medium and vocals from a singer when the singer sings into a microphone, comprising:
   an adjustor for adjusting a volume level of said microphone;
   a level detector for detecting said volume level;
   a music piece detector for detecting an ending or starting point of each music piece; and
   a controller that previously stores a standard volume level, and further compares, when a detected signal is outputted from said music piece detector, the level of an output value from said level detector and said previously stored standard volume level, and controls said adjustor so as to equalize the level of said output value from said level detector to said previously stored standard level.

2. A karaoke apparatus which generates through a loudspeaker a music piece from a recording medium and vocals from a singer when the singer sings into a microphone, comprising:
   an adjustor for adjusting a volume level of said microphone;

a level detector for detecting said volume level of the microphone;

a music piece detector for detecting an ending or starting point of each music piece;

a comparator that detects an output level from said adjustor, compares said output level and a predetermined reference level, and sends a signal when said output level is greater than said predetermined reference level; and a controller that previously stores a standard volume level of the microphone; controls said adjustor for lowering said volume level of the microphone by a predetermined value in accordance with said signal sent from said comparator; wherein said controller further compares, when a detected signal is outputted from said music piece detector, the level of an output value from said level detector and said previously stored standard volume level of the microphone and controls said adjustor so as to equalize the level of said output value from said level detector to said previously stored standard volume level of the microphone.

3. A karaoke equipment as claimed in claim 1 or 2, wherein said adjustor further comprises a motor for adjusting said volume level, and a motor controller for activating said motor, said motor controller being activated in accordance with an output signal from said controller.

4. A method for controlling a karaoke apparatus which generates through a loudspeaker a music piece from a recording medium and vocals from a singer when the singer sings into a microphone, comprising the steps of:

adjusting a volume level of said microphone using an adjustor;

detecting and storing said adjusted volume level;

detecting an ending or starting portion of said music piece and a current volume level at that moment;

comparing said current volume level and said stored adjusted volume level in response to said detection of an ending or starting portion of a music piece; and equalizing said volume level to said stored adjusted volume level.

5. A method of controlling a karaoke apparatus which generates through a loudspeaker a music piece from a recording medium and vocals from a singer when the singer sings into a microphone, comprising the steps of:

adjusting a volume level of said microphone using an adjustor;

detecting and storing said adjusted volume level;

comparing an output level from said adjustor and a predetermined reference level;

lowering said output level by a predetermined value each time said output level is detected to be greater than said predetermined reference level;

detecting an ending or starting portion of a music piece and a current volume level of the microphone;

comparing said current volume level and said stored adjusted volume level in response to said detection of an ending or starting portion of a music piece; and equalizing said volume level to said stored adjusted volume level.

* * * * *